United States Patent
Huang et al.

(10) Patent No.: US 9,836,099 B2
(45) Date of Patent: Dec. 5, 2017

(54) ULTRATHIN HEAT REMOVER FOR PORTABLE ELECTRONIC DEVICE

(71) Applicant: AzTrong Inc., Rockville, MD (US)

(72) Inventors: Kung-Shiuh Huang, Orange, CA (US); Kuan-Tsae Huang, Rockville, MD (US); June Wu, North Potomac, MD (US)

(73) Assignee: AZTRONG INC., Rockville, MD (US)

( * ) Notice: Subject to any disclaimer, the term of this patent is extended or adjusted under 35 U.S.C. 154(b) by 0 days.

(21) Appl. No.: 14/509,740

(22) Filed: Oct. 8, 2014

(65) Prior Publication Data
US 2016/0183414 A1    Jun. 23, 2016

(51) Int. Cl.
*G06F 1/20* (2006.01)
*H01L 23/367* (2006.01)
*H01L 23/373* (2006.01)

(52) U.S. Cl.
CPC .......... *G06F 1/203* (2013.01); *H01L 23/3672* (2013.01); *H01L 23/373* (2013.01)

(58) Field of Classification Search
CPC .................................. G06F 1/20; G06F 1/203
USPC ......................... 361/679.46–679.54, 688–723
See application file for complete search history.

(56) References Cited

U.S. PATENT DOCUMENTS

| | | | |
|---|---|---|---|
| 9,095,077 B2* | 7/2015 | Bhardwaj | H05K 7/20481 |
| 2015/0075186 A1* | 3/2015 | Prajapati | F25B 21/02 62/3.7 |
| 2015/0241092 A1* | 8/2015 | Park | F25B 21/04 62/3.2 |
| 2015/0241935 A1* | 8/2015 | Jang | G06F 1/203 361/679.54 |

* cited by examiner

*Primary Examiner* — Zachary M Pape
(74) *Attorney, Agent, or Firm* — Ditthavong & Steiner, P.C.

(57) ABSTRACT

A portable electronic device includes at least one energy module which further included thermoelectric materials which may convert heat to electric power. The energy module may supply power to at least one of heat generating component in the portable electronic device. A heat remover composed of graphene may be in thermal contact with the at least one of the components. The heat remover may also disposed over a surface of the energy module and may be formed one or more heat conduction path.

14 Claims, 7 Drawing Sheets

ULTRATHIN HEAT REMOVER FOR PORTABLE ELECTRONIC DEVICE

BACKGROUND

Technical Field

The present disclosure relates to heat dissipation in electronic devices. More specifically, the present embodiments related to an electronic device having a flexible and ultrathin heat remover for portable electronic devices.

Related Art

Electronic devices may include housing, window cover secured to the housing, and a set of packed components which are packed within a pocket size of housing. Powerful computer components allow the design and construction of higher performance portable computing devices. However, the use of such powerful computer components often results in increased heat generation by these computing devices. Therefore, improved heat dissipation technology or structure is often needed to maintain operating temperatures of the electronic devices within proper range.

The heat-dissipation mechanisms for electronic devices generally involve the use of extra materials and/or parts. For instance, cooling fans, vents, heat pipes may be employed to remove heat from components in an electronic device.

Hence, compact designs for portable electronic devices may be designed by components and/or materials to avoid hot spots near certain components such as a processor, display, and/or storage.

SUMMARY OF THE INVENTION

Many aspects of the embodiments related to techniques for spreading of heat throughout a computer system or efficiently expelling heat to avoid overheat near certain components such as display, CPU, GPU, and other temperature sensitive components inside a compact electronic device. The portable electronic device comprises a battery pack, at least one of a processor, power manage unit (PMU), at least one display module, at least one printed circuit board (PCB), at least one flexible printed circuit board (FPCB), or solid state disk (SSD), hard disk drive (HDD), or radio transceiver, and other components.

BRIEF DESCRIPTION OF THE FIGURES

The present invention is illustrated by way of example and not limitation in the figures of the accompanying drawing. The components in the drawings are not necessarily drawn to scale.

DETAILED DESCRIPTION

Graphite is composed of layers of carbon atoms that are arranged in 6-membered, hexagonal rings. These rings are attached to one another on their edges. Layers of fused rings can be modeled as an infinite series of fused benzene rings (without the hydrogen atoms).

The following table shows the comparison of thickness for different materials.

|  | Graphene | Grapheme thermal film | Graphite |
| --- | --- | --- | --- |
| Thickness (um) | 1-100 nm | >10 | 25-200 |

A graphene layer disclosed in the embodiments is ranged in 1-5 nm, 1-20 nm, 20-30 nm, 5-100 nm, and/or less than 1 mm.

The disclosure is illustrated by way of example and not by way of limitation in figures of the drawings. It should be noted that references to "an" or "one" embodiment in this disclosure are not necessarily to the same embodiment, and such references mean at least one.

Figure 1:
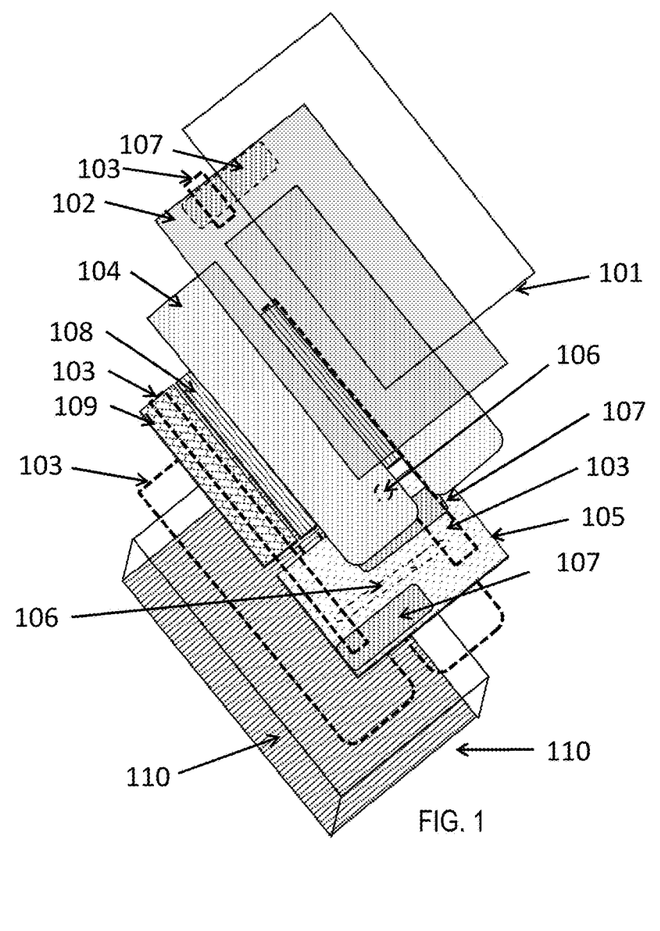
FIG. 1. Shows an electronic device 100 having an exterior housing, battery, and other parts (which may not show in the figure)
Figure 2:
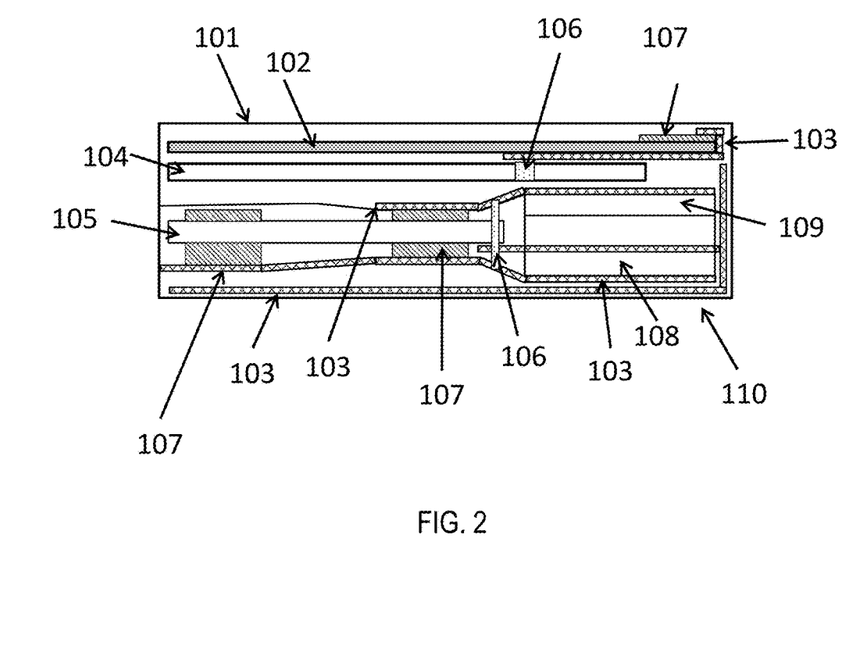
FIG. 2. Shows a cross-sectional view of a portable electronic device in accordance with the disclosed embodiments.

FIG. 1. shows the overview of the arrangement of components within a portable electronic device. The portable electronic device may correspond to a wrist-worn device, tablet, laptop, personal digital assistant (PDA), medial player, mobile phone, digital camera/camcorder, and/or any battery-powered electronic device. Referring to FIG. 1 and FIG. 2, a first energy module 108 (referred to in the claims as a second energy module) and an optional second energy module 109 (referred to in the claims as at least one energy module) may be placed side-by-side with a circuit board, which may be printed circuit board (PCB) 105 or flexible printed circuit board (FPCB), within the housing for portable electronic device. Note that FIG. 1. only shows an overview of the electronic device, not all the detail components are disclosed.

The display module may be placed next to the first energy module 108 and the second energy module 109 and the circuit board. There is an optional reinforce plate 104 sandwiched between the circuit board and the display module. The optional reinforce plate 104 may include a penetration zone 106 therein which allows for an extension 112 of the heat remover 103 to pass therethrough.

The first and second energy modules may supply power to circuit board, display module, and/or other components of portable electronic device. In addition, the first and/or second energy modules may comprises thermoelectric materials as a submodule, which converts heat to electrical energy (and the reverse) with no moving parts. The first and second energy modules can provide electronic energy transfer from/to each other depends on the location of the thermoelectric submodule.

In particular, at least one heat generating component 107 on a side of the circuit board. At least one heat generating component 107 on the other side of the circuit board. At least one heat generating component 107 on the rear side of the display module. The at least one heat generating component 107 may be semiconductor chip, radio frequency (RF) chip, and/or other electronic components.

The operation of portable electronic device may generate heat with usage of the heat generating components 107 as discussed in above paragraphs. This may results in an increase in the temperature(s) of the components. For instance, the user operations on the portable electronic device may cause the central processing unit (CPU) and associated chips of the device to heat up. Therefore, the local temperature(s) buildup may cause injury to a user. In addition, the electronic components/parts may lose reliability, and/or fail prematurely.

Therefore, the portable electronic device may include structures for removing heat from the components inside the portable electronic device.

Because heat-dissipation materials may take up space within the portable electronic device and may also increase the material and assembly costs for portable electronic device. A heat remover/spreader may be flexible and comprising at least one layer of graphite may be positioned over the surface of the first energy module 108 or the second energy module 109, or both of the first energy module 108 and the second energy module 109. A heat remover/spreader 103 comprising at least one layer of graphite may be positioned in thermal contact with circuit board and/or at least one heat generating component 107 inside the portable electronic device to allow heat generated by the at least one heat generating component 107 to spread to the first energy module 108 or the second energy module 109, or both of the first energy module 108 and the second energy module 109, the enclosure of the portable electronic device, and/or a top layer of the display module. The thickness of the at least one layer of the graphite/graphene/thermal film is as discussed in previous paragraph.

FIG. 2 shows a cross-sectional view of a portable electronic device in accordance with the disclosed embodiments with transparent screen 101 located on the top wall of the upper housing or entire housing.

A first heat conduction means thermally connected between the at least one heat generating component 107, on one side of the circuit board, and one of the first energy module 108 or the second energy module 109, or both of the first energy module 108 and the second energy module 109 (not shown). In addition, the first heat conduction has the direction of the heat conduction from the at least one heat generating component 107, on one side of the circuit board, to one of the first energy module 108 or the second energy module 109, or both of the first energy module 108 or the second energy module 109.

A second heat conduction means thermally connected between the at least one heat generating component 107, on the other side of the circuit board, and one of the first energy module 108 or the second energy module 109, or both of the first energy module 108 and the second energy module (not shown). In addition, the second heat conduction has the direction of the heat conduction from the at least one heat generating component 107, on the other side of the circuit board, to one of the first energy module 108 or the second energy module 109, or both of the first energy module 108 and the second energy module 109.

A third heat conduction means thermally connected between the at least one heat generating component 107, on the display module 102, and one of the first energy module 108 or the second energy module 109, or both of the first energy module 108 and the second energy module (not shown). In addition, the third heat conduction has the direction of the heat conduction from the at least one heat generating component 107, on the display module 102, to one of the first energy module 108 or the second energy module 109, or both of the first energy module 108 and the second energy module 109.

A fourth heat conduction means thermally connected between the at least one heat generating component 107 and at least one of a side wall of a housing of the portable electronic device. In addition, the fourth heat conduction has the direction of the heat conduction from the at least one heat generating component 107 to the at least one of a side wall of a housing of the portable electronic device. The side wall which allows the heat conduction may be any side wall which comprising the exterior surface of the portable electronic device.

Figure 3A:
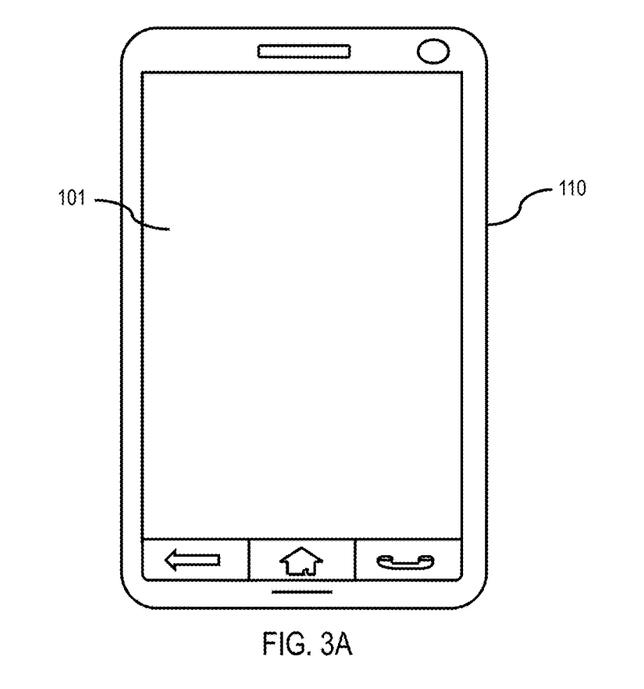
FIG. 3A shows a transparent screen 101 located on the top wall of a housing 110.
Figure 3B:
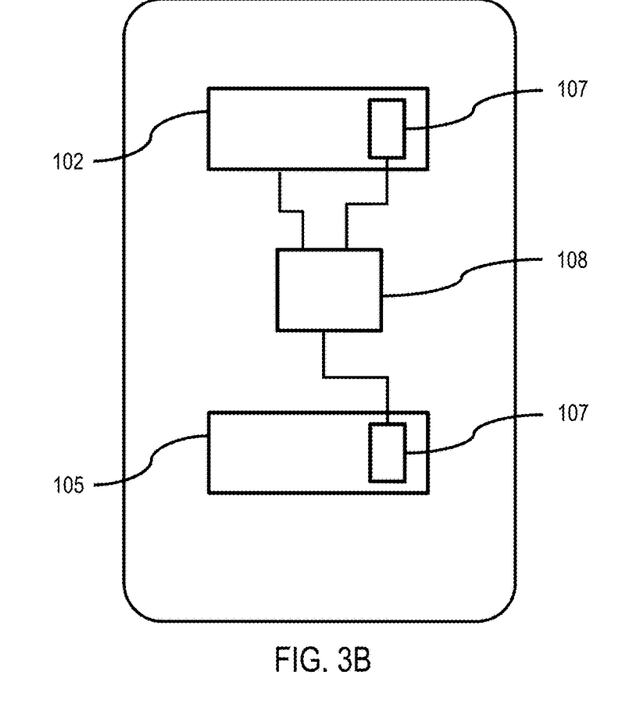
FIG. 3B shows a display module 102 and a circuit board 105 comprising a heat generating component 107, and an energy module 108 that provide electronic power to a heat generating component 107 and/or the display module 102.
Figure 3C:
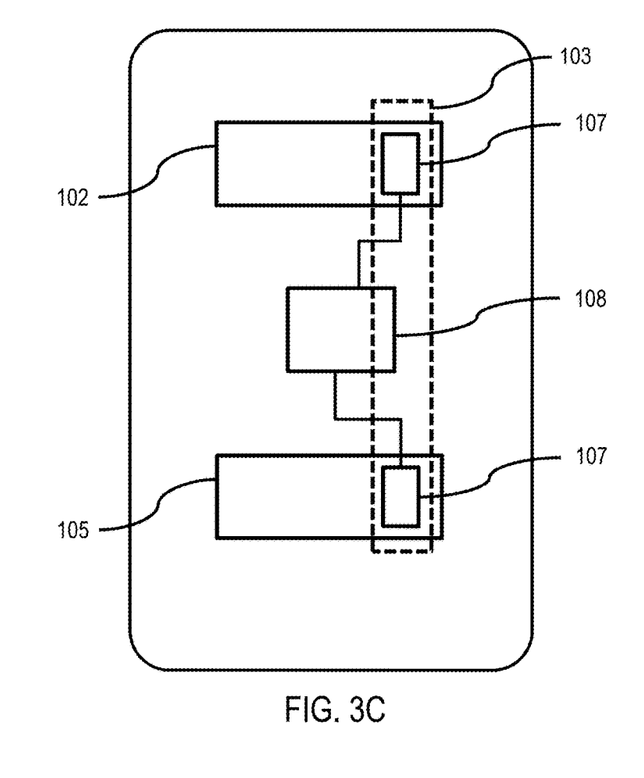
FIG. 3C shows a heat remover 103 disposed over a surface of the energy module 108 and in contact with the heat generating component 107.
Figure 3D:
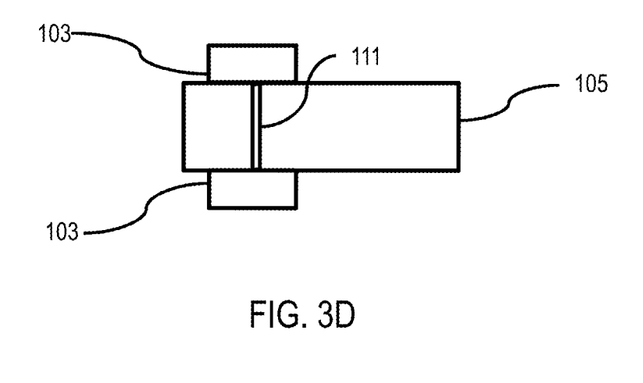
FIG. 3D shows a cross-sectional view of a circuit board 105 comprising of heat remover 103 on both sides and a heat conduction via 111.
Figure 3E:
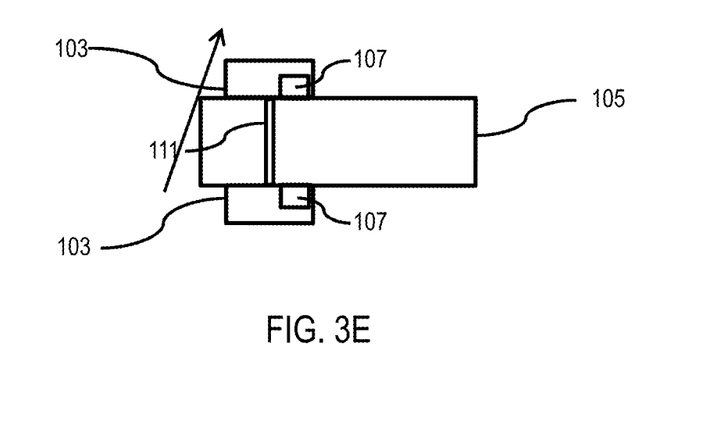
FIG. 3E shows a cross-sectional view of a circuit board 105 wherein the heat remover 103 is in contact with a heat generating component 107.

A first penetration heat conduction means a first penetration zone 106 formed on a circuit board 105 comprising a heat conduction via 111 which allowing heat conducting from a heat remover 103 on one side of the circuit board to another heat remover 103 on the other side of the circuit board 105 through an extension 112 of the heat remover 103. The heat conduction via may comprising heat conduction materials such as metal or graphite/graphene, or composition of metal and graphite/graphene. The metal materials may comprising cropper, aluminum, gold and/or other thermal conduction materials. The heat conduction via may further included a contact surface on each side of the heat conduction via. Therefore, the heat remover 103 on each side of the circuit board can attach to the heat conduction via and form the complete heat conduction path from the heat generator on one side of the circuit board to the heat generator and/or energy module on the other side of the circuit board connected to the other heat remover 103 on the opposite side of the circuit board. The heat conduction via could be implemented as a slot with a width narrower than a length, therefore the heat conducting materials can pass through. Alternatively, the heat conduction via could be a group of cylinder via with a diameter allowed for the heat conducting materials, discussed in this invention, to fill-in or pass through.

The first penetration zone 106 may further comprising a heat conduction through hole and/or slot which is sized to allow a portion of the heat remover 103 to penetrate. Therefore, the heat remover 103 on each side of the circuit board can be arranged through the first penetration zone 106 and form the complete heat conduction path from the heat generator on one side of the circuit board to the heat generator and/or energy module on the other side of the circuit board. The thickness or the diameter of the heat conduction via could be the same dimension range of the graphite/graphene/thermal film is as discussed in previous paragraphs As discussed above, the heat remover 103 may be composed of graphene. The heat remover 103 may be disposed over a surface of any energy module and/or a surface of any heat generating component 107 by attaching a monolayer of graphene onto the surface of the surface of any energy module and/or the surface of any heat generating component 107.

Furthermore, the use of graphene in the heat remover/spreader may reduce the amount of space occupied by the heat remover/spreader very significantly while providing highly effective dissipation of heat from heat generator or heat source. The thermal conductivity of graphene near room temperature may range from $4.8\pm0.5\times10^3$ to $5.3\pm0.5\times10^3$ $Wm^{-1}$ $K^{-1}$, which is obvious better than other materials like graphite, copper, gold, carbon nanotube and/or diamond. Therefore, heat remover 103 may remove heat away from any heat generator/source more effectively than any known material, included graphite, copper, gold, carbon nanotube and/or diamond. Using graphene will increase reliability, safety, and performance during use of the portable electronic device.

In addition, the character of high tensile strength of graphene may results in a graphene monolayer less than one nanometer thickness to be used as heat remover/spreader compared to other heat spreader materials which may range in thickness from tens of microns to a millimeter scale. Consequently, as discussed above, the reduction in thickness/space sized by heat remover 103 may results in a decrease in the portable electronic device's size/thickness and an increase in the portable electronic device's portability or design attractiveness. On the other hand, the extra space savings may increase the size of the energy module; add more components to the portable electronic device, therefore, further improve the functionality or operation hours of the portable electronic device.

The process of facilitating the use of heat remover 103 comprising graphene in a portable electronic device in accordance with the disclosed embodiment(s) comprising:

First, the circuit board and/or display module 102 with at least one heat generating component 107 are arranged within an enclosure of the portable electronic device. Then, the at least one energy module is arranged closed to the at least one heat generating component 107. The at least one heat generating component may include a CPU, a graphic process unit (GPU), a PSU, a PCB, a RF components, a data storage such as SSD, HDD, or RAM, a backlight, a LED, a charging circuit, a signal circuit.

The energy module may correspond to a lithium-ion, solid-state or lithium-polymer battery, and/or thermoelectric materials which can convert the heat to electrical energy (and the reverse) with no moving parts.

Second, the heat remover 103 comprising graphene is disposed over a surface of the energy module allowing heat transfer in either way. The graphene may be grown on a substrate and/or exfoliated from graphite. Then, the graphene is pressed onto the surface of the energy module. A adhesive material may be applied between the heat remover 103 and the surface of the energy module.

Third, the heat remover 103 comprising graphene is applied to the at least one of the heat generating component 107 with thermal contact. Therefore, the heat remover 103 may be extended over the battery onto the surface of a circuit board which is located side-by-side, with offset, or in parallel with the battery. With this arrangement step, the heat remover 103 may transfer heat from the components to the energy module and/or other parts/components of the portable electronic device. As a result, the temperature of the energy module may increase and further extend runtime of the energy module which may include solid-state battery as discussed above.

The disclosed heat remover 103 can be used in any type of electronic comprising data processor (CPU, GPU, PSU, PMU), a storage (RAM, SSD, etc.), a display, and energy module which provides power and/or convert heat to power. The portable electronic device may correspond to a wrist-worn device, tablet, laptop, personal digital assistant (PDA), medial player, mobile phone, digital camera/camcorder, and/or any battery-powered electronic device. Energy module may correspond to a battery pack included one or more battery cells along with a thermoelectric materials. The heat remover 103 comprising graphene may be disposed over a contact surface of the energy module (included thermoelectric materials) and in thermal contact with the at least one of the heat generating component 107 (as discussed above) of the portable electronic device. The heat remover 103 may transfer heat from the at least one components to the energy module and/or other portion of the portable electronic device.

While certain embodiments have been described and shown in the accompanying drawings, it is to be understood, even though information as to, that such embodiments are merely illustrative and not restrictive of the current invention, and this invention is not restricted to the specific constructions and arrangements shown and described since modifications may apply to those ordinarily skilled in the art. Additionally, changes may be made in detail, especially in the matters of size, shape, and arrangement of parts within the present embodiments to the full extend indicated by the broad general meaning of the terms in which the appended claims are expressed.

What is claimed is:

1. A portable electronic device, comprising:
   a housing comprising a top wall, a bottom wall, and at least one side wall; the top wall comprising a transparent screen;
   a display module comprising at least one heat generating component, wherein the display module generates an image and displays through the transparent screen;
   a circuit board comprising at least one heat generating component on at least one side of the circuit board;
   at least one energy module which provide electronic power to the at least one heat generating component on the display module, the at least one heat generating component on the circuit board, or the display module depending on an operation of the portable electronic device;
   a first heat remover disposed over a surface of the at least one energy module and in contact with the at least one heat generating component on either the display module or the circuit board, wherein the first heat remover comprises graphene;
   at least one other heat generating component on the circuit board wherein the at least one other heat generating component is in contact with a second heat remover;
   wherein the first heat remover is thermally connected between the at least one heat generating component on the at least one side of the circuit board and the at least one energy module; and the first heat remover has a direction of heat conduction from the
   at least one heat generating component on the at least one side of the circuit board to the at least one energy module, and;
   a first penetration heat conduction comprising a penetration zone formed on the circuit board comprising a heat conduction via, the heat conduction via allows heat conducting from the second heat remover on the other side of the circuit board to the first heat remover on the at least one side of the circuit board, wherein the heat conduction via comprises graphene.

2. The portable electronic device of claim 1, wherein a second energy module located next to and electronically connect to the at least one energy module, the at least one energy module or the second energy module comprises a thermoelectric submodule which converts heat to electrical energy with no moving parts.

3. The portable electronic device of claim 1, wherein the second heat remover further disposed over a surface of the second energy module.

4. The portable electronic device of claim 1, wherein the second heat remover further disposed over an interior surface of the housing.

5. The portable electronic device of claim 1, wherein a reinforce plate located between the display module and the at least one energy module or the circuit board.

6. The portable electronic device of claim 5, wherein a penetration zone formed on the reinforce plate, wherein the penetration zone of the reinforce plate allows an extension of the first heat remover to pass through.

7. The portable electronic device of claim 6, wherein the extension of the first heat remover thermally connect the first heat remover on one side of the reinforce plate and a third heat remover on the other side of the reinforce plate.

8. A portable electronic device, comprising:
a housing comprising a top wall, a bottom wall, and at least one side wall; the top wall comprising a transparent screen;
a display module comprising at least one heat generating component, wherein the display module generates an image and displays through the transparent screen;
a circuit board comprising at least one heat generating component on at least one side of the circuit board;
at least one energy module which provide electronic power to the at least one heat generating component on the display module, the at least one heat generating component on the circuit board, and/or the display module;
a first heat remover disposed over a surface of the at least one energy module and in contact with the at least one heat generating component on either the display module or the circuit board, wherein the first heat remover comprises graphene;
a reinforce plate sandwiched between the display module and the at least one energy module or the circuit board, wherein a penetration zone formed on the reinforce plate, wherein the penetration zone of the reinforce plate allows an extension of the first heat remover to pass through;
and a second energy module located next to and electronically connect to the at least one energy module, the at least one energy module or the second energy module comprises a thermoelectric submodule which converts heat to electrical energy with no moving parts, wherein the at least one energy module or the second energy module with the thermoelectric submodule charges electronic power to the other one of the at least one energy module or the second energy module.

9. The portable electronic device of claim 8, wherein the first heat remover further disposed over an interior surface of the housing.

10. The portable electronic device of claim 9, wherein the extension of the first heat remover thermally connect the first heat remover disposed over the surface of the at least one energy module and a third heat remover disposed over the surface of the at least one heat generating component on the display module.

11. The portable electronic device of claim 10, wherein the extension of the first heat remover passes through the penetration zone formed on the reinforce plate.

12. The portable electronic device of claim 10, wherein a second extension of the first heat remover passes through a penetration zone formed on the circuit board, the penetration zone formed on the circuit board comprising a heat conduction via, the heat conduction via allows heat conducting from a second heat remover on the other side of the circuit board to the first heat remover on the at least one side of the circuit board, wherein the heat conduction via comprises graphene.

13. A portable electronic device, comprising:
a housing comprising a top wall, a bottom wall, and at least one side wall; the top wall comprising a transparent screen;
a circuit board comprising at least one heat generating component on at least one side of the circuit board;
a display module comprising at least one heat generating component, wherein the display module generates an image and displays through the transparent screen;
at least one energy module which provide electronic power to the at least one heat generating component on the display module, the at least one heat generating component on the circuit board, and/or the display module;
a first heat remover disposed over a surface of the at least one energy module and in contact with the at least one heat generating component on either one of the display module and the circuit board, wherein the first heat remover comprises a layer of thermal conduct material; and
a reinforce plate sandwiched between the display module and the at least one energy module or the circuit board, wherein a penetration zone formed on the reinforce plate, wherein the
penetration zone of the reinforce plate allows an extension of the first heat remover to pass through; and a slot formed on the penetration zone of the reinforce plate with a width sized in 1-20 nm.

14. A portable electronic device, comprising:
a housing comprising a top wall, a bottom wall, and at least one side wall; the top wall comprising a transparent screen;
a circuit board comprising at least one heat generating component on at least one side of the circuit board, wherein the circuit board is arranged in parallel with the display module in longitudinal direction;
the display module comprising at least one heat generating component, wherein the display module generates an image and displays through the transparent screen;
at least one energy module which provide electronic power to the at least one heat generating component on the display module, the at least one heat generating component on the circuit board, and/or the display module, wherein the at least one energy module is arranged in parallel with the display module in longitudinal direction and in side by side position with the circuit board; and
a first heat remover disposed over a surface of the at least one energy module and in contact with the at least one heat generating component on either one of the display module and the circuit board, wherein the first heat remover comprises a layer of thermal conduct material; wherein a gap between the at least one energy module and the display module is formed with a thickness sized in 1-20 nm.

* * * * *